(12) United States Patent
Güttler et al.

(10) Patent No.: US 7,056,763 B2
(45) Date of Patent: Jun. 6, 2006

(54) COMPOSITE STRUCTURE FOR ELECTRONIC MICROSYSTEMS AND METHOD FOR PRODUCTION OF SAID COMPOSITE STRUCTURE

(75) Inventors: Herbert Güttler, Elchingen (DE); Peter Koidl, Denzlingen (DE); Matthias Seelmann-Eggebert, Freiburg (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 352 days.

(21) Appl. No.: 10/344,533

(22) PCT Filed: Aug. 31, 2002

(86) PCT No.: PCT/DE01/03418

§ 371 (c)(1),
(2), (4) Date: Apr. 15, 2003

(87) PCT Pub. No.: WO02/19403

PCT Pub. Date: Mar. 7, 2002

(65) Prior Publication Data

US 2003/0157746 A1 Aug. 21, 2003

(30) Foreign Application Priority Data

Sep. 1, 2000 (DE) .............................. 100 43 511

(51) Int. Cl.
*H01L 21/00* (2006.01)
(52) U.S. Cl. .................................... 438/105
(58) Field of Classification Search ................ 438/487, 438/200, 164, 123, 105, 16, 14, 1; 429/231.95, 429/40; 428/469; 427/598, 554, 553, 469, 427/248; 257/77
See application file for complete search history.

(56) References Cited

U.S. PATENT DOCUMENTS 5,525,537 A 6/1996 Zachai et al.

(Continued)

FOREIGN PATENT DOCUMENTS

DE C2 43 13 042 10/1993

(Continued)

OTHER PUBLICATIONS

Alex Gicquel et al: Diamond Growth Mechanisms in Various Environments, Journal of The Electrochemical Society, 147 (6), pp. 2218-2226, 2000.

(Continued)

*Primary Examiner*—Craig A. Thompson
*Assistant Examiner*—Monica D. Harrison
(74) *Attorney, Agent, or Firm*—Breiner & Breiner, L.L.C.

(57) ABSTRACT

The invention relates to a composite structure for electronic microsystems and a method for producing this composite structure, with the composite structure being provided with a polycrystalline diamond layer (4) for heat withdrawal. The growth substrate (1) contains or forms a component layer (2) with the electronic microsystems, which are provided with binary or higher order component compound semiconductors. A protective layer (3), which encloses the component layer at least indirectly almost entirely, is placed between the component layer 2 and the diamond layer (4). A material is selected for the protective layer whose reactivity with the precursor materials present in the deposition of the diamond layer (4) by means of CVD, preferably by means of plasma CVD, is smaller than that of the component layer (2), and said protective layer. In order for the protective layer (3) to develop sufficient effectivity, it must be applied with an original thickness of at least 20 nm, preferably at least 50 nm and particularly preferred at least 100 nm.

16 Claims, 4 Drawing Sheets

U.S. PATENT DOCUMENTS

| | | |
|---|---|---|
| 5,656,828 A | 8/1997 | Zachai et al. |
| 5,767,578 A | 6/1998 | Chang et al. |
| 5,837,322 A | 11/1998 | Moran et al. |
| 5,861,058 A | 1/1999 | Fuesser et al. |
| 6,025,094 A * | 2/2000 | Visco et al. ........... 429/231.95 |
| 6,110,759 A | 8/2000 | Konrad et al. |

FOREIGN PATENT DOCUMENTS

| | | |
|---|---|---|
| EP | A1 0 282 054 | 9/1988 |
| JP | 63-224226 | 9/1988 |

OTHER PUBLICATIONS

R. Ramesham, "Selective Growth And Characterization Of Doped Polycrystalline Diamond Thin Films", Thin Solid Films, Elsevier-Sequoia S.A., vol. 229, No. 1, Jun. 5, 1993, pp. 44-50, XP000370672.

* cited by examiner

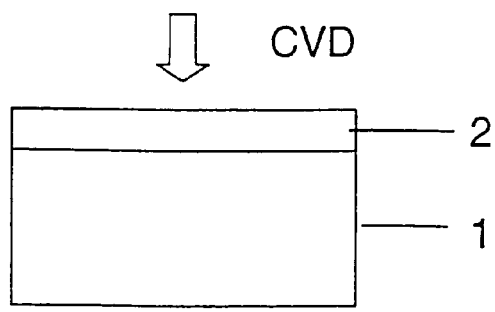
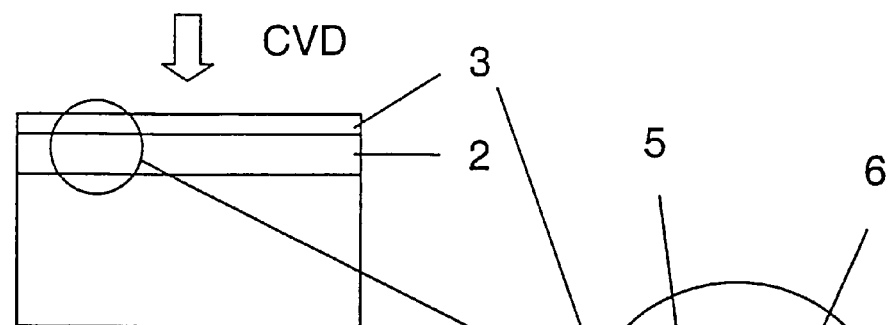
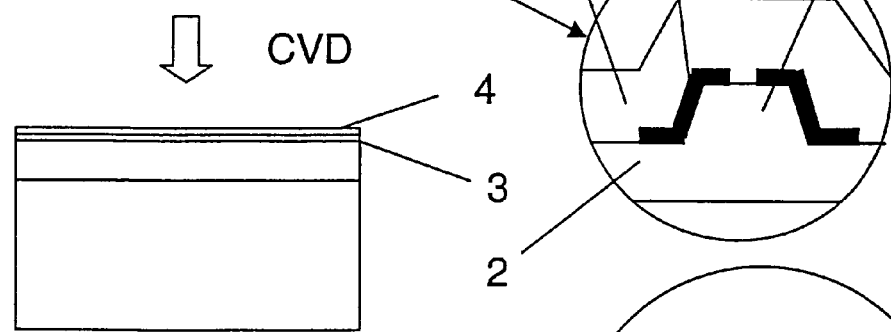
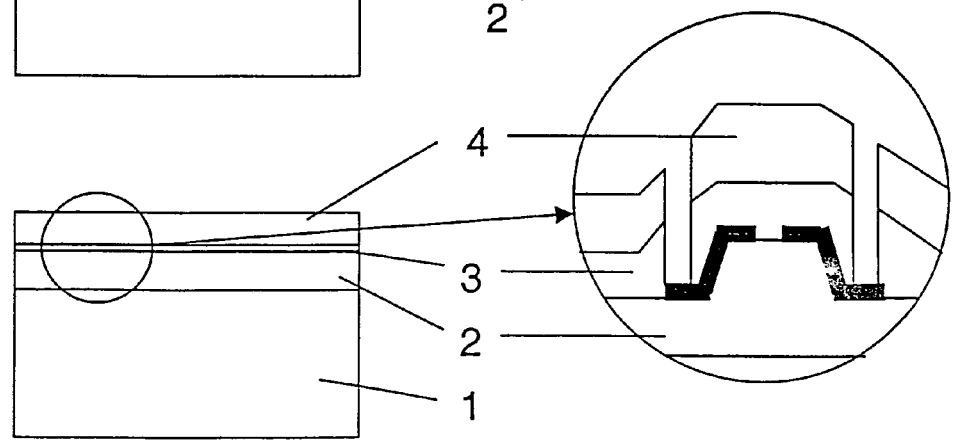
Figure 6a
Figure 6b
Figure 6c
Figure 6d

COMPOSITE STRUCTURE FOR ELECTRONIC MICROSYSTEMS AND METHOD FOR PRODUCTION OF SAID COMPOSITE STRUCTURE

FIELD OF INVENTION

The present invention relates to a composite structure for electronic systems and a method for production of this composite structure as they both are described in the generic printed publication DE 197 18 618 C2 on which the present invention is based.

BACKGROUND OF THE INVENTION

DE 197 18 618 C2 describes a composite structure in which microelectronic components, such as transistors, diodes, resistors, capacitors, inductive resistors, etc., or circuits made thereof, such as amplifiers, sensors, emission cathodes for electrons, etc., placed on a growth substrate of monocrystalline silicon are provided with a diamond thermoconductive layer. The printed publication also discloses a corresponding plasma CVD for applying the diamond layer. The thermoconductive layer is made of diamond, among other things, because this material also possesses good thermoconductivity despite electric insulation. Such a type of thermoconductive layer made, in particular, of polycrystalline diamond is, therefore, excellently suited for thermal management of microelectronic components.

However, depositing the diamond layer on the components must occur at, for epitaxial growth, low temperatures in order not to impair or even destroy the components.

Furthermore, despite the thermal expansion differing from that of the coated materials, adhesion of the diamond layer to the coated surface has to be good. Due to these conditions, the epitaxial growth of aforementioned diamond thermoconductive layer must be conducted with great care.

With, in particular, growth substrates and/or components provided with binary, ternary, quaternary or even higher grade compound semiconductors, there is the problem that these materials react very strongly with the hydrogenous plasma during application of the diamond, thereby destroying and/or even completely removing these materials.

EP 0681 314 A2 describes the production of a composite structure in which a crystalline-arranged, i.e. heteroepitactic in relation to the substrate, diamond layer is deposited on a suited monocrystalline growth substrate, e.g. of Si or GaAs, by means of an intermediate layer with a continues lattice structure. The goal is a structurally high grade diamond layer that is suited for production of electronic components on a diamond base. The purpose of the substrate is to permit oriented diamond growth and therefore the substrate contains no electronic components. A lattice constant similar as closely as possible to that of the diamond is required for this growth. Lattice mismatching should be reduced by employing a monocrystalline intermediate layer with lattice constants that lie between the lattice constants of the diamond and that of the substrate.

OBJECTS AND BRIEF SUMMARY OF THE INVENTION

The object of the present invention is to develop a composite structure for microelectronic components and a method to produce this composite structure, which at least largely has the already mentioned advantages of a diamond thermoconductive layer.

The object is solved according to the present invention with a composite structure with the features as claimed respectively with a method with the method steps as claimed. Due to the invented application and CVD deposition in sufficient thickness of the substances defined by their chemical reactivity in the claims, the components of the hydrogenous plasma no longer reach the compound semiconductors of the component layer. The component layer of the present composite structure contains electronic microsystems such as for example ICs, semiconductor lasers, sensors, transistors, diodes etc. and/or components such as amplifiers, sensors, emission cathodes for electrons, etc. made thereof.

Expediently, metallic function layers such as strip conductors, etc., which should at least partially not be covered by the diamond layer, are also provided with a protective layer.

Depending on the application respectively based on the background of the to-be-protected materials, nitrides and/or oxides and/or carbides and/or oxynitrides and/or diamond-like carbon, especially silicon nitride, preferably $Si_3Ni_4$ and/or silicon oxide, preferably $SiO_2$, and/or silicon carbide, preferably SiC, and/or silicon oxynitrides have proven to be suited as materials for the protective layer. Moreover, aluminum nitride, preferably AlN, and/or aluminum oxide, preferably $Al_2O_3$, are also suited. The protective layer may be monocrystalline, polycrystalline (e.g. not of stoichiometric Si-nitride) or also amorphous (e.g. of diamond-like carbon).

In order to ensure with certainty the function of the protective layer, its layer thickness is selected in such a manner that it remains connected in a continuous, uninterrupted manner during the entire deposition process of the diamond layer. This applies especially in the case of self-consumption by the components of the plasma, in which the protective layer, although with reduced layer thickness, should nonetheless remain connected in a continuous, uninterrupted manner: i.e. the protective layer must enclose the pertinent materials at least until a continuous, uninterrupted diamond layer has been deposited. Despite the arrangement of such types of protective layers which, due to their low thermoconductivity, may negatively influence withdrawing heat from the diamond layer, heat withdrawal in the invented composite structures is still sufficient due to the remaining reduced thickness of the protective layers following deposition of the diamond layer.

The quality of the layer system composed of the diamond layer and the intermediate layer placed on the component layer for heat withdrawal is given by the quality factor. The quality factor of the thermal measure corresponds to the relationship between the temperature rise without the thermal measure, i.e. without the layer system, to the temperature rise with the layer system. Temperature rise refers to the difference between the peak temperature reached in the component layer during designated operation of the electronic components and circuits integrated therein and the ambient temperature. In the present method, the thickness of the diamond layer and the thickness of the intermediate layer are preferably measured in such a manner that the finished composite structure has a quality of 1.5 or more. This quality factor depends, among other things, on the thickness of the intermediate layer. With a given thickness of the diamond layer, the thickness of the intermediate layer must be designed during deposition in such a manner that the above condition is fulfilled, i.e. the intermediate layer should not exceed a certain thickness in the finished composite structure. This maximum thickness depends on the thermoconductivity of the intermediate layer. If poorly thermoconductive silicon nitride is employed as the intermediate layer, its thickness should not be more than 20 nm. With AlN as the intermediate layer, 200 nm is tolerable.

Ideally, the thickness of the intermediate layer is selected prior to applying the diamond layer in such a manner that it is, in particular in the case of poor thermoconductivity, only a few atom layers thick after application of the diamond layer.

Further useful embodiments of the invention are set forth in the corresponding subclaims. Moreover, the invention is made more apparent using the preferred embodiments depicted in the accompanying figures.

BRIEF DESCRIPTION OF THE DRAWINGS

FIGS. 6a–6d show schematic single steps of the method for producing the present composite structure.

DETAILED DESCRIPTION OF THE INVENTION

Figure 1:
FIG. 1 shows a 100-fold magnification of a broken edge of an uncoated InP growth substrate.

FIG. 1 shows a 100-fold magnification of a broken edge of an uncoated InP growth substrate that was exposed to the process conditions for only a few seconds like those occurring during deposition of diamond by means of a BIAS-aided plasma CVD. It is quite evident that the InP growth substrate has been badly impaired. Corresponding tests have shown that an InP substrate of conventional layer thickness is etched completely through within only a few minutes.

Figure 2:
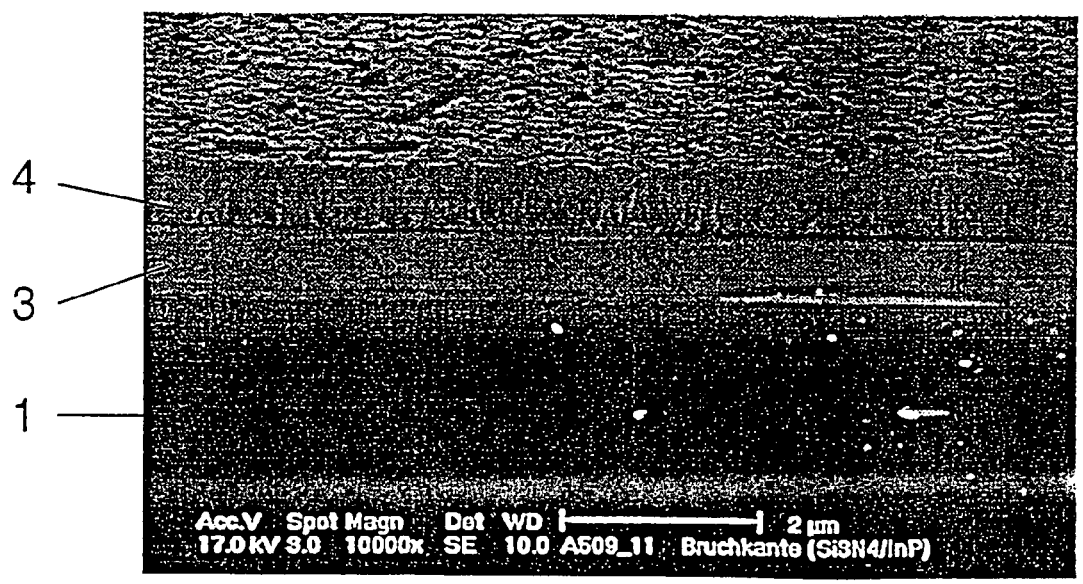
FIG. 2 shows a 10,000-fold magnification of an InP growth substrate provided with a protective layer and a diamond layer.

FIG. 2 shows a 10,000-fold magnified broken edge of a coated InP growth substrate 1 that was coated first with a protective layer $Si_3N_4$ 3, then with the polycrystalline diamond layer 4. This test revealed that the layer thickness of the protective layer 3 should be at least 20 nm before deposition of the diamond layer, preferably at least 50 nm and particularly preferred at least 100 nm.

Figure 3:
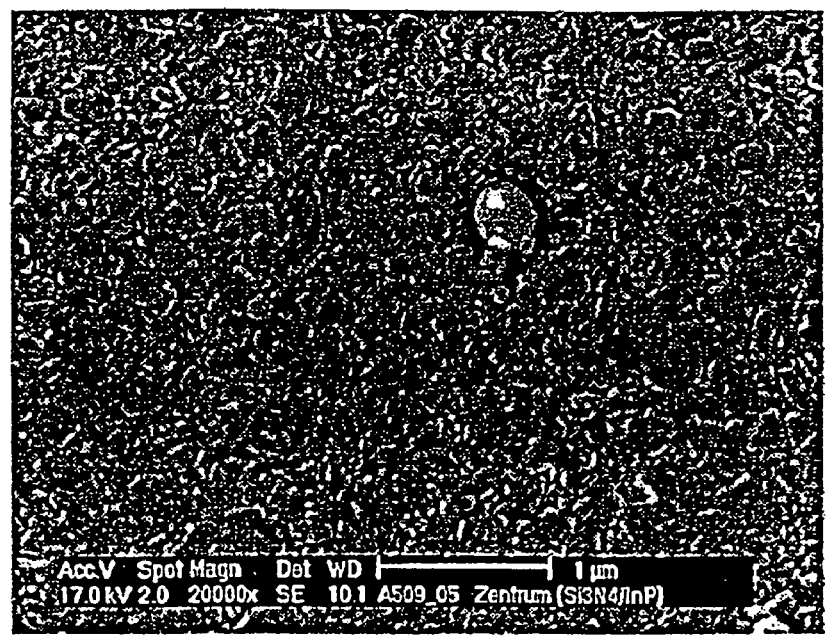
FIG. 3 shows a 20,000-fold magnification of the surface of the composite structure according to FIG. 2.

FIG. 3 shows a 1:20,000-fold magnification of the diamond surface of the composite structure according to claim 2. This figure shows the polycrystalline character of the diamond layer particularly distinctly.

Figure 4:
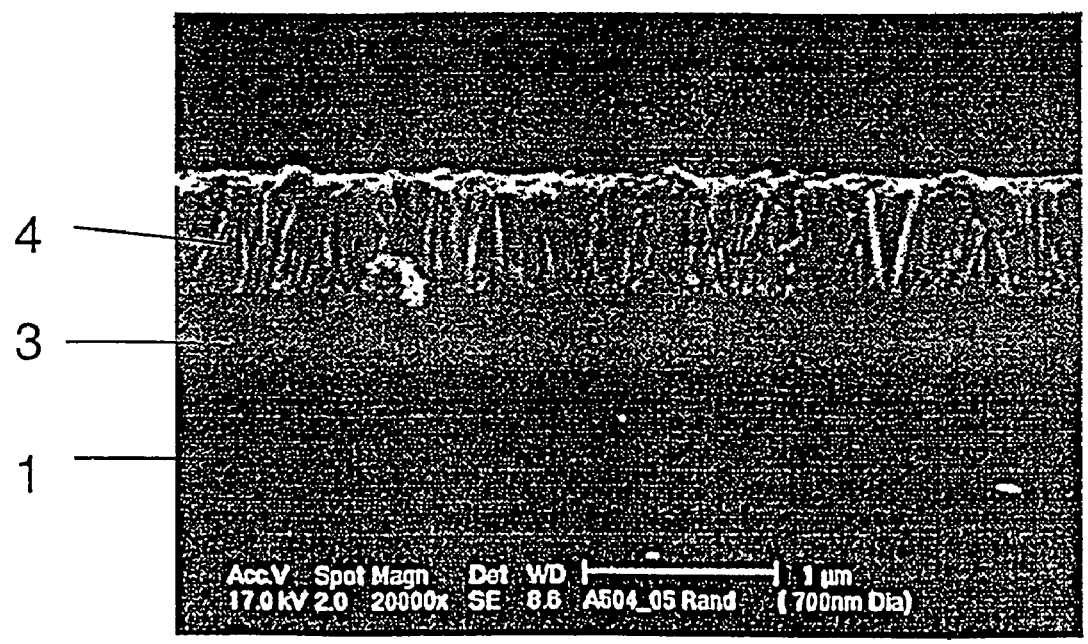
FIG. 4 shows a 20,000-fold magnification of a GaAs growth substrate provided with a protective layer and a diamond layer.

FIG. 4 shows a 20,000-fold magnification of a broken edge of a coated GaAs growth substrate 1. The GaAs growth substrate 1 was first coated with a protective layer 3 of $Si_3N_4$ and then with the polycrystalline diamond layer 4. It was again revealed that the layer thickness of the protective layer 3 should be at least 20 nm before commencing deposition of the diamond layer 4, preferably at least 50 nm and particularly preferred at least 100 nm.

Figure 5:
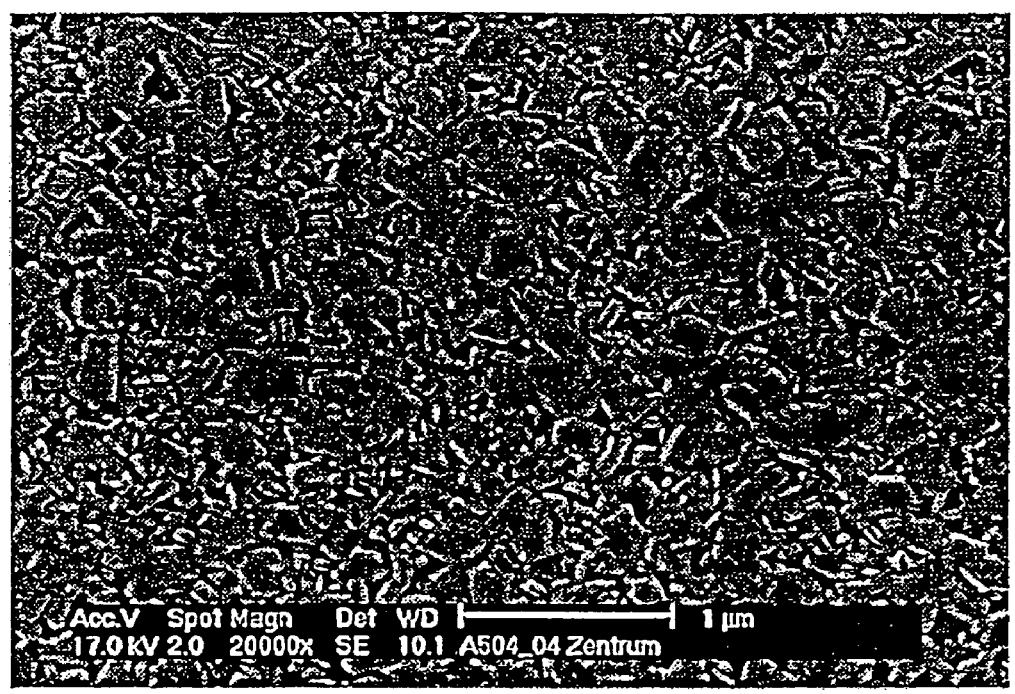
FIG. 5 shows a 20,000-fold magnification of the surface of the composite structure according to FIG. 4.

FIG. 5 shows a 1:20,000-fold magnification of the diamond surface of the composite structure according to FIG. 4.

This figure, too, shows the polycrystalline character of the diamond layer particularly distinctly.

The protective layer and the diamond layer were each produced by means of a prior art EIAS-aided plasma CVD process. The parameters used in the process are listed in the following table.

| | |
| --- | --- |
| DC power | 2.7 kW |
| Substrate temp. | 180–360° C. |
| Pressure | 10.0–14.6 slm |
| Gas flow | 0.5 mbar |
| Carbon sources | $CH_4$, $C_2H_4$ |
| Ratio C/H | 0.15–0.3% |
| Ratio O/C | 30–100% |

Details concerning a method of depositing a diamond layer can be found, for example, in the publication by M. Seelmann-Eggebert et al., "Heat-Spreading Diamond Films for GaN-based High-Power Transistor Devices", Diamond and Related Materials 10, 2001, pp. 744–749. The content of its disclosure is included in the present summary of the invention.

FIGS. 6a–6d show schematically single steps of the method for producing the present composite structure. First a growth substrate 1 provided with a component layer with electronic microsystems is provided for (FIG. 6a). The component layer 2 can be made of, for example, GaN, the growth substrate of sapphire. In the next step, a protective layer 3 of $Si_3N_4$ is applied onto the component layer 2, with layer 3 enclosing the component layer 2 entirely (FIG. 6b). The magnified detail on the right shows as an example a component 6 of this component layer 2 with the respective connection metallization 5. Then a polycrystalline diamond layer is deposited on the protective layer 3 by means of plasma CVD. During the first period of this deposition, still before there is a thin, full-surface diamond layer, the protective layer 3 is attacked by the plasma during application of the diamond and, if need be, reduced in thickness. After a thin, full-surface diamond layer has been deposited, reduction stops (FIG. 6c), which is depicted exaggeratedly in the figure. The diamond layer deposition process continues until the desired layer thickness has been attained (FIG. 6d).

Using a mask, for example with the aid of a structured photoresist, during the diamond deposition ensures that the diamond layer does not cover the connection metallization 5 regions. The protective layer 3 is then removed from these regions so that they are accessible for external contacting (cf. magnified detail of FIG. 6d).

What is claimed is:

1. A method for producing a composite structure for electronic microsystems, comprising:

providing a growth substrate including a component layer with said electronic Microsystems, said component layer including binary or higher order compound semiconductors;

applying onto said component layer a protective layer which encloses said component layer at least indirectly completely; and applying onto said protective layer a polycrystalline diamond layer for heat withdrawal by CVD wherein material for said protective layer has chemical reactivity with precursor materials present during said applying of said diamond layer by said CVD which is lower than that of the component layer, and wherein said protective layer is applied with an original layer thickness of at least 20 nm.

2. The method according to claim 1, wherein said protective layer comprises nitrides and/or oxides and/or carbides and/or oxynitrides and/or diamond-like carbon.

3. The method according to claim 1, wherein said protective layer comprises silicon nitride, and/or silicon oxide, and/or silicon carbide, and/or silicon oxynitrides.

4. The method according to claim 1, wherein said protective layer comprises aluminum nitride, and/or aluminum oxide.

5. The method according to claim 1, further comprising at least a plurality of metallic function layers disposed at least regionwise within said diamond layer and/or at least cover regionwise said diamond layer.

6. The method according to one of claims 1 to 5, wherein all surface regions of said component layer which come into contact with the precursor materials of said diamond layer are covered with said protective layer.

7. The method according to one of claims 1 to 5, wherein the layer thickness of said protective layer is selected in such a manner that after application of said diamond layer, said layer thickness has a value which yields a thermal quality factor of said diamond layer and said protective layer of 1.5 or more.

8. The method according to claim 1, wherein said CVD is plasma CVD.

9. A composite structure for electronic microsystems, comprising:
   a growth substrate including a component layer with said electronic microsytems, and a polycrystalline diamond layer for withdrawal of heat, wherein said component layer includes binary or higher order compound semiconductors; and
   a protective layer, which encloses said component layer at least indirectly completely, disposed between said component layer and said diamond layer, and a chemical reactivity of said protective layer with precursor materials present during deposition of the diamond layer by CVD which is lower than a corresponding chemical reactivity of said component layer.

10. The composite structure according to claim 9, wherein said protective layer comprises nitrides and/or oxides and/or carbides and/or oxynitrides and/or diamond-like carbon.

11. The composite structure according to claim 9, wherein said protective layer comprises silicon nitride, and/or silicon oxide, and/or silicon carbide, and/or silicon oxynitrides.

12. The composite structure according to claim 9, wherein said protective layer comprises aluminum nitride, and/or aluminum oxide.

13. The composite structure according to claim 9, wherein at least a plurality of metallic function layers are disposed at least regionwise within said diamond layer and/or at least cover regionwise said diamond layer.

14. The composite structure of claim 13, wherein said metallic function layers are strip conductors.

15. The composite structure according to claim 9, wherein all surface regions of said component layer which come into contact with the precursor materials of said diamond layer are covered with said protective layer.

16. The composite structure according to one of claims 9 to 15, wherein a layer thickness of said protective layer has a value with which a thermal quality factor of said diamond layer and protective layer of 1.5 or more is achieved.

* * * * *

UNITED STATES PATENT AND TRADEMARK OFFICE
CERTIFICATE OF CORRECTION

| | |
|---|---|
| PATENT NO. | : 7,056,763 B2 |
| APPLICATION NO. | : 10/344533 |
| DATED | : June 6, 2006 |
| INVENTOR(S) | : Herbert Güttler et al. |

It is certified that error appears in the above-identified patent and that said Letters Patent is hereby corrected as shown below:

On The Title Page, Item, " (22) PCT Filed: Aug. 31, 2002"
  Should read -- (22) PCT Filed: Aug. 31, 2001 --.

Column 4,
Line 54, "Microsystems," should read -- microsystems, --.

Signed and Sealed this

Fifth Day of September, 2006

JON W. DUDAS
*Director of the United States Patent and Trademark Office*